(12) United States Patent
Purdy et al.

(10) Patent No.: US 6,967,068 B1
(45) Date of Patent: Nov. 22, 2005

(54) METHOD OF CONTROLLING STEPPER PROCESS PARAMETERS BASED UPON OPTICAL PROPERTIES OF INCOMING ANTI-REFLECTING COATING LAYERS, AND SYSTEM FOR ACCOMPLISHING SAME

(75) Inventors: Matthew A. Purdy, Austin, TX (US); Joyce S. Oey Hewett, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 553 days.

(21) Appl. No.: 10/046,422

(22) Filed: Nov. 7, 2001

(51) Int. Cl.[7] ............................................. G03F 7/00
(52) U.S. Cl. ....................................... 430/30; 430/311
(58) Field of Search .................... 430/30, 311–315; 700/121, 123; 427/8–10

(56) References Cited

U.S. PATENT DOCUMENTS

| | | | |
|---|---|---|---|
| 6,368,762 B1 * | 4/2002 | Ling | ........................... 430/30 |
| 6,479,200 B1 * | 11/2002 | Stirton | ........................... 430/30 |
| 6,482,573 B1 * | 11/2002 | Bhakta et al. | ............... 430/313 |
| 6,689,519 B2 * | 2/2004 | Brown et al. | ................. 430/30 |
| 2002/0076843 A1 * | 6/2002 | Ruelke et al. | ................. 438/29 |

* cited by examiner

*Primary Examiner*—Kathleen Duda
(74) *Attorney, Agent, or Firm*—Williams, Morgan & Amerson, P.C.

(57) ABSTRACT

A method comprised of forming a process layer above a wafer, forming an ARC layer above the process layer, determining at least one optical characteristic of the ARC layer, and determining, based upon the determined optical characteristic of the ARC layer, at least one parameter of a stepper exposure process. The present invention is also directed to a system that may be used to perform the methods described herein. In one embodiment, the system is comprised of an optical metrology tool for measuring at least one optical characteristic of an ARC layer formed above a process layer, a controller for determining, based upon data obtained from the optical metrology tool, at least one parameter of a stepper exposure process, and a stepper tool for performing the exposure process comprised of the determined at least one parameter.

33 Claims, 3 Drawing Sheets

METHOD OF CONTROLLING STEPPER PROCESS PARAMETERS BASED UPON OPTICAL PROPERTIES OF INCOMING ANTI-REFLECTING COATING LAYERS, AND SYSTEM FOR ACCOMPLISHING SAME

BACKGROUND OF THE INVENTION

1. Field of the Invention

This invention relates generally to semiconductor fabrication technology, and, more particularly, to a method of controlling stepper process parameters based upon the optical properties of incoming anti-reflecting coating layers, and a system for accomplishing same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

By way of background, an illustrative field effect transistor 10, as shown in FIG. 1, may be formed above a surface 15 of a semiconducting substrate or wafer 11 comprised of doped-silicon. The substrate 11 may be doped with either N-type or P-type dopant materials. The transistor 10 may have a doped polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 for the transistor 10 may be formed by performing one or more ion implantation processes to introduce dopant atoms, e.g., arsenic or phosphorous for NMOS devices, boron for PMOS devices, into the substrate 11. Shallow trench isolation regions 18 may be provided to isolate the transistor 10 electrically from neighboring semiconductor devices, such as other transistors (not shown).

In the process of forming integrated circuit devices, millions of transistors, such as the illustrative transistor 10 depicted in FIG. 1, are formed above a semiconducting substrate. In general, semiconductor manufacturing operations involve, among other things, the formation of layers of various materials, e.g., polysilicon, insulating materials, metals, etc., and the selective removal of portions of those layers by performing known photolithographic and etching techniques. These processes, along with various ion implant and heating processes, are continued until such time as the integrated circuit device is complete. Additionally, although not depicted in FIG. 1, a typical integrated circuit device is comprised of a plurality of conductive interconnections, such as conductive lines and conductive contacts or vias, positioned in multiple layers of insulating material formed above the substrate. These conductive interconnections allow electrical signals to propagate between the transistors formed above the substrate.

During the course of fabricating such integrated circuit devices, a variety of features, e.g., gate electrodes, conductive lines, openings in layers of insulating material, etc., are formed to very precisely controlled dimensions. Such dimensions are sometimes referred to as the critical dimension (CD) of the feature. It is very important in modern semiconductor processing that features be formed as accurately as possible due to the reduced size of those features in such modern devices. For example, gate electrodes may now be patterned to a width 12 that is approximately 0.18 $\mu$m (1800 Å), and further reductions are planned in the future. The width 12 of the gate electrode 14 corresponds approximately to the channel length 13 of the transistor 10 when it is operational. Of course, the critical dimension 12 of the gate electrode 14 is but one example of a feature that must be formed very accurately in modern semiconductor manufacturing operations. Other examples include, but are not limited to, conductive lines, openings in insulating layers to allow subsequent formation of a conductive interconnection, i.e., a conductive line or contact, therein, etc. Thus, even slight variations in the actual dimension of the feature as fabricated may adversely affect device performance. Thus, there is a great desire for a method that may be used to accurately, reliably and repeatedly form features to their desired critical dimension, e.g., to form the gate electrode 14 to its desired critical dimension 12.

Photolithography is a process typically employed in semiconductor manufacturing. Photolithography generally involves forming a patterned layer of photoresist above one or more layers of material that are desired to be patterned and using the patterned photoresist layer as a mask in subsequent etching processes. In general, in photolithography operations, the pattern desired to be formed in the underlying layer or layers of material is initially formed on a reticle. Thereafter, using an appropriate stepper tool and known photolithographic techniques, the image on the reticle is transferred to the layer of photoresist. Then, the layer of photoresist is developed so as to leave in place a patterned layer of photoresist substantially corresponding to the pattern on the reticle. This patterned layer of photoresist is then used as a mask in subsequent etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features, that are to be replicated in an underlying process layer. The features in the patterned layer of photoresist also have a critical dimension, sometimes referred to as a develop inspect critical dimension (DICD).

Due to steadily decreasing feature sizes in semiconductor devices, it is essential not only to steadily reduce the wavelength of the light sources used in stepper tools, but also to optimize the process of energy deposition in the photoresist layer. Such optimization is required because even minor deviations from the desired pattern in the photoresist masking layer may result in irregularities of the final features, which, in turn, may reduce the reliability of the final device or even cause a total failure. One source of such undesired and uncontrollable energy deposition in the photoresist resides in the reflectivity of the underlying material layer(s) to be patterned. In particular, if one of the underlying material layers that is desired to be patterned is comprised of a metal, such as aluminum, the reflectivity of this metal layer may exceed a value of approximately 90%. Since the light reflected from the underlying layer(s) will expose resist portions that are intended to remain unexposed, resulting in an undesired broadening of features, it is desirable to suppress reflection of an underlying layer as much as possible. To this end, anti-reflective coatings (ARCs) are typically used in the photolithography process for patterning features of critical dimensions.

An ARC layer formed on top of a process layer that is to be patterned is typically designed so as to reduce the amount of light that is reflected back into the photoresist from the underlying process layer. For this purpose, three optical parameters, namely refractive index "n," extinction coefficient "k" and thickness "d" of the ARC layer, have to be properly selected such that an appropriate phase shift is created between the light reflected at the interface between the ARC layer and the underlying process layer, and the light reflected at the interface between the ARC layer and the photoresist masking layer. If the above-mentioned three parameters "n," "k," "d" are properly adjusted to the wavelength of the light source used in the stepper tool, the reflectivity of underlying layers can be drastically reduced.

FIG. 2 depicts an illustrative embodiment of a wafer 11 that may be subjected to an exposure process in a stepper tool. As shown in FIG. 2, a plurality of die 42 are formed above the wafer 11. The die 42 define the area of the wafer 11 where production integrated circuit devices, e.g., microprocessors, ASICs, memory devices, will be formed. The size, shape and number of die 42 per wafer 11 depend upon the type of device under construction. For example, several hundred die 42 may be formed above an 8-inch diameter wafer 11. The wafer 11 may also have an alignment notch 17 that is used to provide relatively rough alignment of the wafer 11 prior to performing certain processes, e.g., an exposure process in a stepper tool.

The exposure process performed on the wafer 11 is typically performed on a flash-by-flash basis as the wafer 11 is moved, or stepped, relative to the light source 47. During each step, the light source (not shown) in the stepper projects light onto a given area of the wafer 11, i.e., each flash is projected onto an exposure field 41. The size of the exposure field 41, as well as the number of die 42 within each exposure field 41, may vary greatly. For example, an illustrative exposure field 41 is depicted in FIG. 2 wherein four of the die 42 fall within the exposure field 41, i.e., a so-called 2×2 pattern. However, the number of die 42 and size of the exposure field 41 may vary. For example, integrated circuits may be exposed using a 1×2 pattern (covering 2 die), a 5×5 pattern (covering 25 die), etc. The precise pattern of the exposure field 41 may be based upon the product under construction as well as the desires and judgment of the appropriate process engineer.

The optical characteristics of the ARC layer are very important if the exposure process is to result in a photoresist masking layer having the desired DICD dimensions. For example, optical characteristics such as the index of refraction ("n") and the dielectric constant ("k") of the ARC layer at a particular exposure wavelength, e.g., 248 nm, may impact the ability of the stepper process to produce accordingly-sized features in the layer of photoresist. More particularly, variations in these optical characteristics can cause control problems in modern manufacturing operations with its inherently low tolerance for process variations due to the very small absolute size of the features to be formed. The optical characteristics of the ARC layer may vary from wafer-to-wafer and/or from lot-to-lot due to a variety of reasons. For example, thickness variations in the ARC layer from wafer-to-wafer and/or lot-to-lot will cause the optical characteristics of these ARC layers to vary. Additionally, there may be variations in the processes, typically deposition processes, used to form the ARC layer, e.g., variations in process gases, temperature, cleanliness, film stoichiometry, etc., all of which may cause variations in the optical characteristics of the resulting ARC layers.

The variations of the optical characteristics of an ARC layer may tend to cause the DICD of features formed in the patterned layer of photoresist to be less or greater than desired. In turn, this may lead to excessive rework of the patterned layer of photoresist, i.e., the incorrectly formed layer of photoresist may have to be removed, and the process may have to be repeated. Even worse, if undetected, the variations in the patterned layer of photoresist resist resulting from the variations in the optical properties of the ARC layer, may ultimately lead to the formation of features, e.g., gate electrodes, having dimensions that are not acceptable for the particular integrated circuit device under construction. For example, transistors may be produced with gate electrodes that are too wide (relative to a pre-established target value), thereby producing transistor devices that operate at less than desirable switching speeds. All of these problems result in delays, waste, excessive costs and cause reduced yields of the manufacturing operations.

The present invention is directed to a method and system that may solve, or at least reduce, some or all of the aforementioned problems.

SUMMARY OF THE INVENTION

The present invention is generally directed to a method of controlling stepper process parameters based upon the optical properties of incoming anti-reflecting coating layers, and a system for accomplishing same. In one illustrative embodiment, the method comprises forming a process layer, forming an ARC layer above the process layer, determining at least one optical characteristic of the ARC layer, and determining, based upon the determined optical characteristic of the ARC layer, at least one parameter of a stepper exposure process.

The present invention is also directed to a system that may be used to perform the methods described herein. In one embodiment, the system is comprised of an optical metrology tool for measuring at least one optical characteristic of an ARC layer formed above a process layer, a controller for determining, based upon data obtained from the optical metrology tool, at least one parameter of a stepper exposure process, and a stepper tool for performing the exposure process comprised of the determined at least one parameter.

BRIEF DESCRIPTION OF THE DRAWINGS

The invention may be understood by reference to the following description taken in conjunction with the accompanying drawings, in which like reference numerals identify like elements, and in which.

Figure 1:
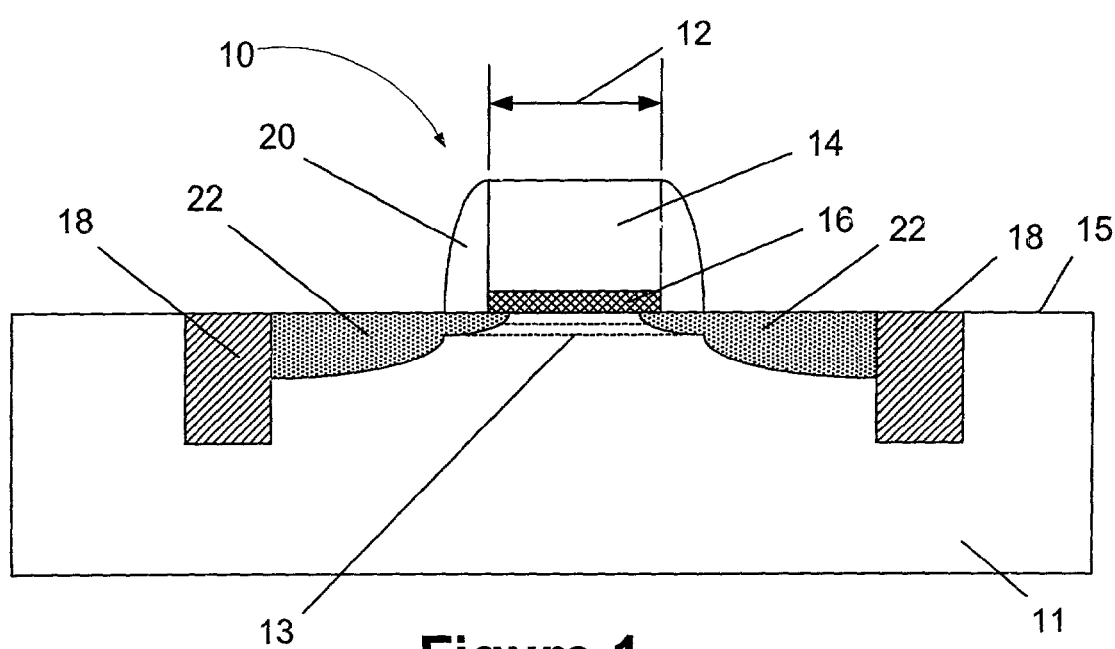
FIG. 1 is a cross-sectional view of an illustrative prior art transistor.
Figure 2:
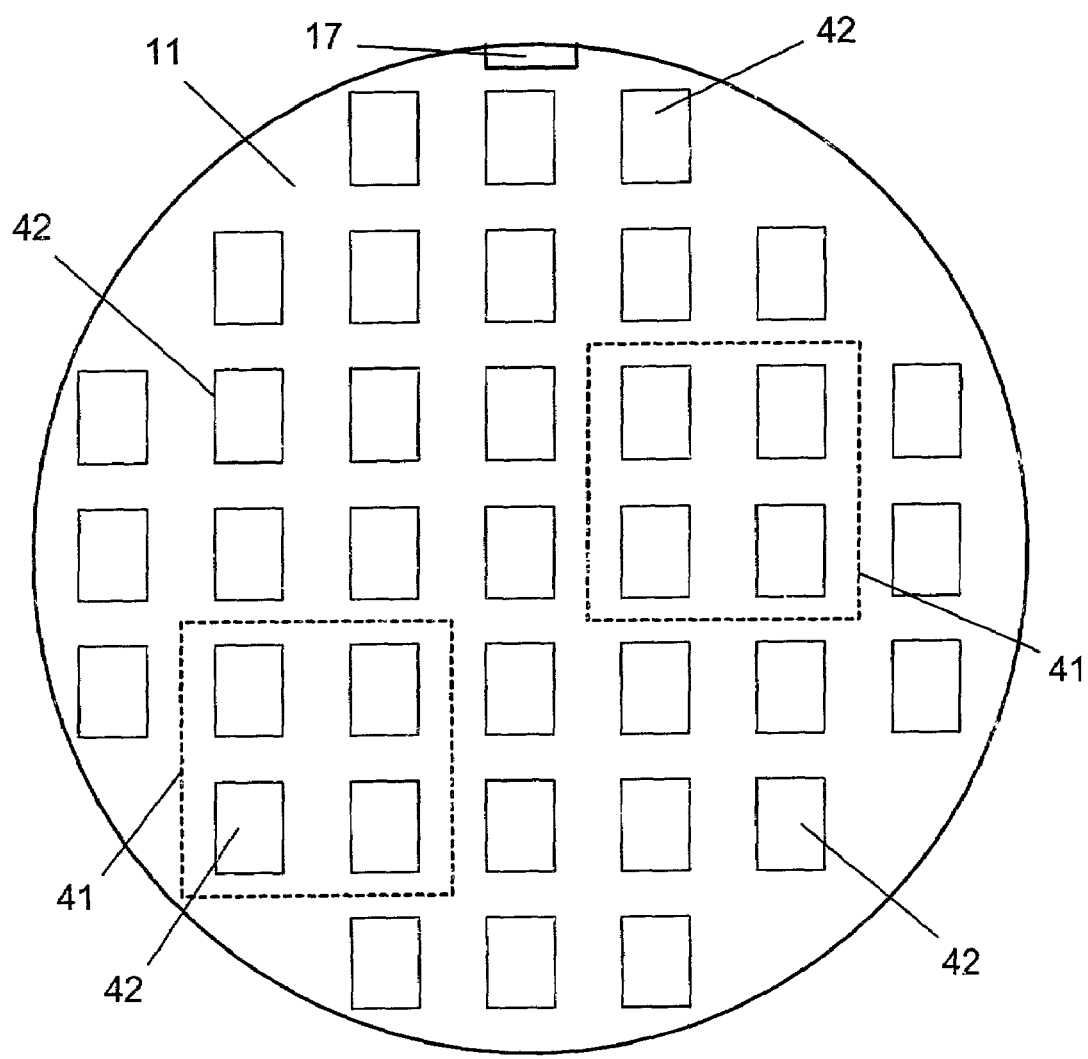
FIG. 2 is a plan view of an illustrative prior art wafer having a plurality of die formed thereabove.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Moreover, for purposes of clarity, the illustrative system depicted herein does not include all of the supporting utilities and devices of such a system. Nevertheless, the attached drawings are included to describe and explain illustrative examples of the present invention.

In general, the present invention is directed to a method of controlling stepper process parameters based upon the optical properties of incoming anti-reflecting coating layers, and a system for accomplishing same. As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc.

Figure 3:
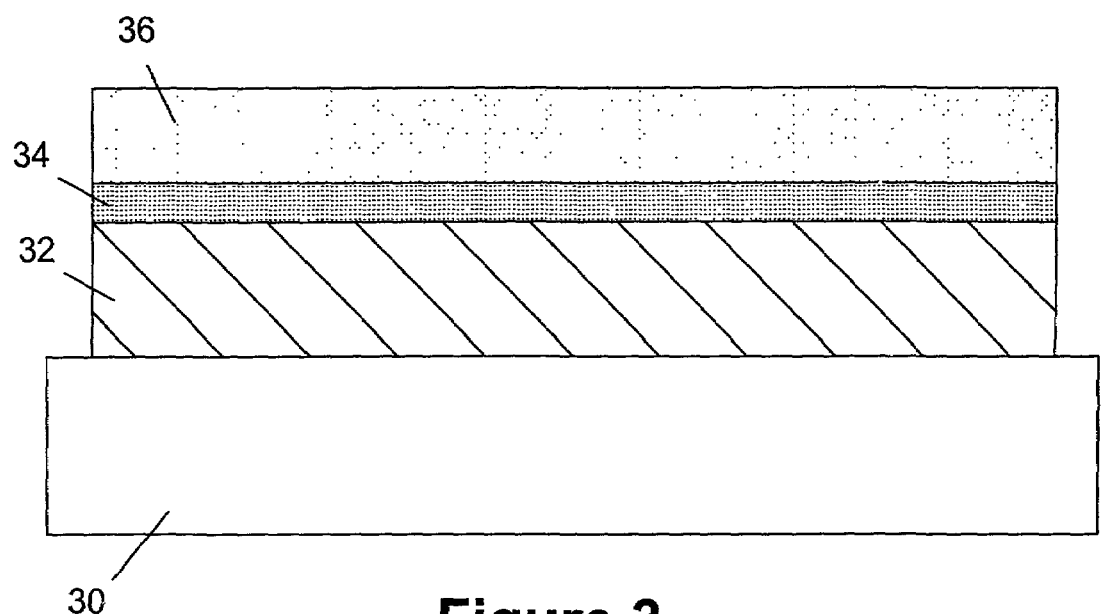
FIG. 3 is a cross-sectional view depicting an illustrative wafer having a plurality of process layers and a layer of photoresist formed thereabove.

As shown in FIG. 3, an illustrative process layer 32 and an ARC layer 34 are formed above a structure 30, and a layer of photoresist material 36 is formed above the ARC layer 34. Ultimately, the layers depicted in FIG. 3 will be subjected to an exposure process in a stepper tool (not shown in FIG. 3). As will be readily apparent to those skilled in the art after a complete reading of the present application, the structure 30 may be a semiconducting substrate, e.g., a silicon wafer, or it may represent one or more previously formed layers of material above such a semiconducting substrate, e.g., a stack of insulating layers each having a plurality of conductive interconnections formed therein. Moreover, the ARC layer 34 may be formed over one of more process layers 32. Thus, the present invention is adaptable to processing a wide variety of combinations of numbers of process layers and types of material.

The illustrative process layer 32 may be comprised of any type of material commonly encountered in semiconducting processing, e.g., polysilicon, a metal, e.g., aluminum, an insulating material, e.g., silicon dioxide, HSQ, or other such materials. Moreover, the process layer 32 may be formed by a variety of techniques used to form such materials, e.g., chemical vapor deposition (CVD), physical vapor deposition (PVD), thermal growth, etc., and the thickness of the process layer 32 may vary greatly.

The ARC layer 34 may also be comprised of a variety of materials. For example, the ARC layer 34 may be comprised of silicon nitride, silicon oxynitride, silicon dioxide and titanium nitride depending upon the particular application. The ARC layer 34 may also be formed by a variety of processes, e.g., CVD, PECVD, and the thickness of the ARC layer 34 may vary. For example, in the context of patterning a process layer 32 comprised of aluminum, an ARC layer 34 comprised of silicon nitride having a thickness of approximately 12–21 nm (170–210 Å) may be used. Similarly, the layer of photoresist 36 may be either a positive or negative type photoresist, and it may be formed by a variety of techniques, e.g., a variety of spin-coating techniques commonly employed in modern semiconductor manufacturing. The layer of photoresist 36 may have a thickness ranging from approximately 0.5–0.8 $\mu$m.

Due to a variety of factors, the optical properties, e.g., reflectivity, index of refraction ("n"), and extinction coefficient ("k") of the ARC layer 34 may vary. Such variations in the optical characteristics of the ARC layer 34 may lead to unacceptable variations in the resulting DICD dimensions of the features formed in the patterned layer of photoresist. In turn, such variations in the DICD dimensions of the photoresist features may result in removing the patterned layer of photoresist and starting the process over. All of these problems tend to reduce the overall efficiency of the manufacturing operations.

In general, the present invention is directed to a method of determining the optical characteristics of the ARC layer 34, and, based upon that information, controlling one or more parameters of an exposure process, e.g., exposure dose, focus. That is, one or more of the optical characteristics of the ARC layer 34 is determined, and that information is fed forward to a controller that controls one or more parameters of an exposure process to be performed on the layers depicted in FIG. 3.

Figure 4:
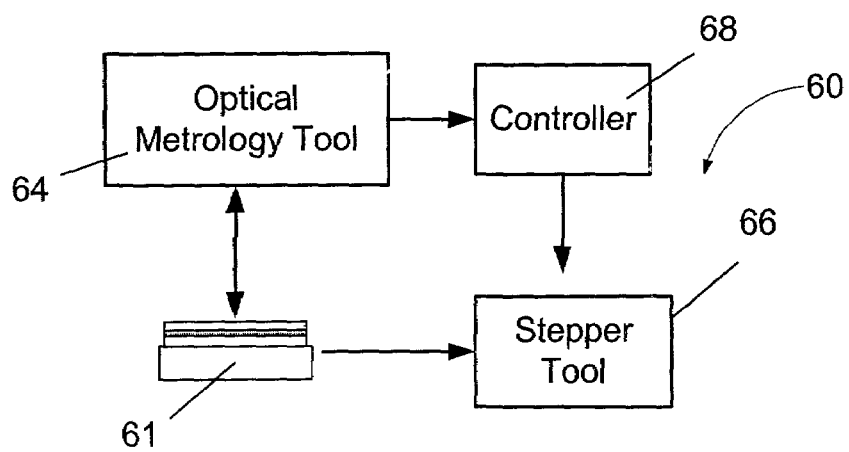
FIG. 4 depicts an illustrative embodiment of a system in accordance with one embodiment of the present invention.

An illustrative system 60 that may be used in one embodiment of the present invention is shown in FIG. 4. The system 60 is comprised of an optical metrology tool 64, a stepper tool 66, and a controller 68. The stepper tool 66 is normally part of a photolithography module formed in modern semiconductor manufacturing facilities. In one embodiment, the optical metrology tool 64 and the stepper tool 66 are all part of a photolithography module. In other embodiments, each of the various components of the system 60 may be separate processing stations.

As indicated in FIG. 4, one or more wafers 61, having at least one process layer 32 and an ARC layer 34 formed thereabove, are provided to the optical metrology tool 64, where one or more of the optical characteristics of the ARC layer 34 is determined. That is, the optical metrology tool 64 may be used to determine or measure one or more optical characteristics of the ARC layer 34, such as the reflectivity, the index of refraction ("n"), and/or the extinction coefficient ("k") of the ARC layer 34. This optical metrology data may then be provided to the controller 68. The optical data provided to the controller 68 may be averaged or otherwise statistically manipulated in the controller 68 or the optical metrology tool 64.

The controller 68 then determines, based upon the optical data obtained by the optical metrology tool 64, one or more parameters of a stepper exposure process to be performed on the ARC layer 34 formed above the wafer 61 or on other wafers having a similar ARC layer formed thereabove. That is, a parameter of the exposure process, e.g., exposure dose, focus, etc., may be determined or varied based upon the determined optical characteristics of the ARC layer 34. For example, if data obtained from the optical metrology tool 64 indicates that the reflectivity of the ARC layer 34 is greater than a preselected target value, or range of values, the exposure dose of the exposure process may be reduced as the increase in reflectivity will tend to lead to wider than anticipated features in the layer of photoresist 36. Conversely, if the reflectivity is less than a target value, the exposure dose may be increased. Similar techniques may be used with other optical parameters, e.g., index of refraction, extinction coefficient, and the focus of the stepper exposure process.

The optical metrology tool 64 may be any type of tool useful for measuring or determining the desired, optical characteristics of the ARC layer 34. For example, the optical metrology tool 64 may be a spectroscopic ellipsometer, a reflectometer or a scatterometer. The optical metrology tool 64 may use white light, or some other wavelength or combination of wavelengths, depending on the specific implementation. Typically, the optical metrology tool 64 will generate an incident beam that has a wide spectral composition and wherein the intensity of the light changes slowly in comparison to changes in wavelength. The angle of incidence of the light may also vary, depending on the specific implementation. The intensity of the reflected light may be measured as s- and p-polarization over either multiple angles or at multiple wavelengths. For example, the optical metrology tool may include a Model OP5230 or OP5240 with a spectroscopic ellipsometer offered by Thermawave, Inc. of Fremont, Calif.

The number of and location of the optical measurements taken of the ARC layer 34 may be varied as a matter of design choice. The more measurements taken, the higher degree of likelihood that the measurements actually reflect the true optical characteristics of the ARC layer 34. However, the responsible process engineer may decide on an appropriate number of measurements to be taken, as well as the location of those measurements consistent with the degree of confidence desired by the process engineer with respect to the particular application under consideration.

The optical measurements of the ARC layer 34 may be performed on any desired number of wafers. For example, such measurements may be performed on all wafers in one or more lots, or on a representative number of wafers in a given lot, and these results may then be used to vary one or more parameters, e.g., the exposure dose, of the exposure process performed in the stepper tool 66 on the measured wafers or on subsequently processed wafers. Additionally, more than one lot of wafers may be analyzed until such time as the process engineer has achieved a sufficiently high degree of confidence that the metrology accurately reflects the optical characteristics of the ARC layer 34 produced by a particular process flow.

As will be recognized by those skilled in the art, various optical characteristics of the ARC layer 34 may vary depending upon the wavelength of the light used during the exposure process. Most modern semiconductor manufacturing facilities tend to use either I-line or deep ultraviolet (DUV) exposure processes. I-line processes tend to use a mercury lamp as the light source and generate a light beam with a wavelength of approximately 365 nm. In deep ultraviolet systems, an excimer laser is generally used as the light source to generate an incident light of a wavelength of approximately 248 nm. It is anticipated that the wavelength of future exposure systems will employ light sources that generate light at a wavelength of 193 nm and 157 nm. As will be recognized by those skilled in the art upon a complete reading of the present application, the present invention may be used with existing technology, and it is readily adaptable to future improvements in exposure technology.

However, the optical metrology tools commonly employed today may only generate an incident light of approximately 300 nm. Since optical characteristics vary with wavelength and, at least with respect to deep ultraviolet systems, the exposure wavelength (approximately 248 nm) is less than that used in present-day optical measurement tools, an error may be induced. That is, the optical characteristics measured using light at a wavelength of approximately 300 nm is not the same as the optical characteristics at the intended exposure wavelength of approximately 248 nm. However, it is believed that any such error is relatively small and well within acceptable levels. Moreover, given the nature of semiconductor processing, other errors in manufacturing operations will tend to make the error introduced due to the mismatch between the wavelength of the optical measurement tool and the exposure wavelength relatively minor.

Control equations may be employed to adjust the operating recipe of the stepper tool 66 in situations where the methods described herein indicate that the ARC layer 34 has less than desirable optical characteristics. The control equations may be developed empirically using commonly known linear or non-linear techniques. The controller 68 may automatically control the operating recipes of the stepper tool 66 used to perform an exposure process. Through use of the present invention, the extent and magnitude of variations in targeted DICD dimensions in a patterned layer of photoresist may be reduced.

In the illustrated embodiment, the controller 68 is a computer programmed with software to implement the functions described herein. Moreover, the functions described for the controller 68 may be performed by one or more controllers spread through the system. For example, the controller 68 may be a fab level controller that is used to control processing operations throughout all or a portion of a semiconductor manufacturing facility. Alternatively, the controller 68 may be a lower level computer that controls only portions or cells of the manufacturing facility. Moreover, the controller 68 may be a stand-alone device, or it may reside on the stepper tool 66 or on a photolithography module (not shown). However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 68, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

The present invention is generally directed to a method of controlling stepper process parameters based upon the optical properties of incoming anti-reflecting coating layers, and a system for accomplishing same. In one illustrative embodiment, the method comprises forming a process layer 32, forming an ARC layer 34 above the process layer 32, determining at least one optical characteristic of the ARC layer 34, and determining, based upon the determined optical characteristic of the ARC layer 34, at least one parameter of a stepper exposure process. The stepper exposure process comprised of the determined parameter(s) may be performed on one or more wafers having similar ARC layers formed thereabove.

In another illustrative embodiment of the present invention, the method comprises forming a process layer above each of a plurality of wafers, forming an ARC layer above each of the process layers, determining at least one optical characteristic of each of the ARC layers, determining, based upon the determined at least one optical characteristic of the ARC layers, at least one parameter of a stepper exposure process, and performing the stepper exposure process on at least one wafer.

The present invention is also directed to a system that may be used to perform the methods described herein. In one embodiment, the system is comprised of an optical metrology tool 64 for measuring at least one optical characteristic of an ARC layer 34 formed above a process layer 32, a controller 68 for determining, based upon data obtained from the optical metrology tool 64, at least one parameter of a stepper exposure process, and a stepper tool 66 for performing the exposure process comprised of the determined at least one parameter.

The present invention is also directed to a system comprised of a metrology means for measuring at least one optical characteristic of an ARC layer 34 formed above a process layer 32, a controller means for determining, based upon data obtained from the metrology means, at least one parameter of a stepper exposure process, and a means for performing the exposure process comprised of the determined at least one parameter. In the disclosed embodiment, the metrology means is the optical metrology tool 64, the controller means is the controller 68 and the means for performing the exposure process is the stepper tool 66.

Through use of the present invention, better process control may be achieved in modern integrated circuit manufacturing facilities. Additionally, the present invention may enable more precise formation of various features of integrated circuit devices, thereby improving device performance and increasing production yields.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a process layer;
   forming an ARC layer above said process layer;
   determining at least one of an index of refraction and an extinction coefficient of said ARC layer;
   determining, based upon said determined at least one of an index of refraction and an extinction coefficient of said ARC layer, at least one parameter of a stepper exposure process; and
   performing said stepper exposure process comprised of said determined at least one parameter on at least one wafer.

2. The method of claim 1, wherein forming a process layer comprises depositing a process layer.

3. The method of claim 1, wherein forming a process layer comprises forming a process layer comprised of at least one of polysilicon, a metal and silicon dioxide.

4. The method of claim 1, wherein forming an ARC layer above said process layer comprises depositing an ARC layer above said process layer.

5. The method of claim 1, wherein forming an ARC layer above said process layer comprises forming an ARC layer comprised of at least one of silicon nitride, silicon oxynitride, silicon dioxide and titanium nitride above said process layer.

6. The method of claim 1, wherein determining at least one of an index of refraction and an extinction coefficient of said ARC layer comprises measuring at least one of an index of refraction and an extinction coefficient of said ARC layer.

7. The method of claim 1, wherein determining at least one of an index of refraction and an extinction coefficient of said ARC layer comprises determining at least one of an index of refraction and an extinction coefficient of said ARC layer by using at least one of a scatterometer, a reflectometer and a spectroscopic ellipsometer.

8. The method of claim 1, wherein determining, based upon said determined at least one of an index of refraction and an extinction coefficient of said ARC layer, at least one parameter of a stepper exposure process comprises determining, based upon said determined optical characteristic of said ARC layer, at least one of an exposure dose and a focus of a stepper exposure process.

9. The method of claim 1, further comprising determining a reflectivity of said ARC layer.

10. The method of claim 1, further comprising performing said stepper exposure process, comprised of said determined at least one parameter, on at least one additional wafer.

11. A method, comprising:
depositing a process layer;
depositing an ARC layer above said process layer;
measuring at least one of an index of refraction and an extinction coefficient of said ARC layer;
determining, based upon said measured at least one of an index of refraction and an extinction coefficient of said ARC layer, at least one parameter of a stepper exposure process; and
performing said stepper exposure process, comprised of said determined at least one parameter, on at least one wafer.

12. The method of claim 11, wherein depositing a process layer comprises depositing a process layer comprised of at least one of polysilicon, a metal and silicon dioxide.

13. The method of claim 11, wherein depositing an ARC layer above said process layer comprises depositing an ARC layer comprised of at least one of silicon nitride, silicon oxynitride, silicon dioxide and titanium nitride above said process layer.

14. The method of claim 11, wherein measuring at least one of an index of refraction and an extinction coefficient of said ARC layer comprises determining at least one of an index of refraction and an extinction coefficient of said ARC layer by using at least one of a scatterometer, a reflectometer and a spectroscopic ellipsometer.

15. The method of claim 11, wherein determining, based upon said measured at least one of an index of refraction and an extinction coefficient of said ARC layer, at least one parameter of a stepper exposure process comprises determining, based upon said measured at least one of an index of refraction and an extinction coefficient of said ARC layer, at least one of an exposure dose and a focus of a stepper exposure process.

16. The method of claim 11, further comprising measuring a reflectivity of said ARC layer.

17. The method of claim 11, further comprising performing said stepper exposure process, comprised of said determined at least one parameter, on at least one additional wafer.

18. A method, comprising:
depositing a process layer;
depositing an ARC layer comprised of at least one of silicon nitride, silicon oxynitride, silicon dioxide and titanium nitride above said process layer;
measuring at least one of an index of refraction and an extinction coefficient of said ARC layer;
determining, based upon said measured at least one of an index of refraction and an extinction coefficient of said ARC layer, at least one parameter comprised of at least one of an exposure dose and a focus of a stepper exposure process; and
performing said stepper exposure process, comprised of said determined at least one parameter, on at least one wafer.

19. The method of claim 18, wherein depositing a process layer comprises depositing a process layer comprised of at least one of polysilicon, a metal and silicon dioxide.

20. The method of claim 18, wherein measuring at least one optical characteristic of said ARC layer comprises determining at least one optical characteristic of said ARC layer by using at least one of a scatterometer, a reflectometer and a spectroscopic ellipsometer.

21. The method of claim 18, wherein measuring at least one optical characteristic of said ARC layer comprises measuring at least one of a reflectivity, an index of refraction, and an extinction coefficient of said ARC layer.

22. The method of claim 18, further comprising performing said stepper exposure process, comprised of said determined at least one parameter, on at least one additional wafer.

23. A method, comprising:
forming a process layer above each of a plurality of wafers;
forming an ARC layer above each of said process layers;
determining at least one of an index of refraction and an extinction coefficient of each of said ARC layers;
determining, based upon said determined at least one of an index of refraction and an extinction coefficient of said ARC layers, at least one parameter of a stepper exposure process; and
performing said stepper exposure process, comprised of said determined at least one parameter, on at least one wafer.

24. The method of claim 23, wherein forming a process layer comprises depositing a process layer.

25. The method of claim 23, wherein forming a process layer comprises forming a process layer comprised of at least one of polysilicon, a metal and silicon dioxide.

26. The method of claim 23, wherein forming an ARC layer above each of said process layers comprises depositing an ARC layer above each of said process layers.

27. The method of claim 23, wherein forming an ARC layer above each of said process layers comprises forming an ARC layer comprised of at least one of silicon nitride, silicon oxynitride, silicon dioxide and titanium nitride above each of said process layers.

28. The method of claim 23, wherein determining at least one of an index of refraction and an extinction coefficient of each of said ARC layers comprises measuring at least one of an index of refraction and an extinction coefficient of each of said ARC layers.

29. The method of claim 23, wherein determining at least one of an index of refraction and an extinction coefficient of each of said ARC layers comprises determining at least one of an index of refraction and an extinction coefficient of each of said ARC layers by using at least one of a scatterometer, a reflectometer and a spectroscopic ellipsometer.

30. The method of claim 23, wherein determining, based upon said determined at least one of an index of refraction and an extinction coefficient of said ARC layers, at least one parameter of a stepper exposure process comprises determining, based upon said determined at least one of an index of refraction and an extinction coefficient of said ARC layers, at least one of an exposure dose and a focus of a stepper exposure process.

31. The method of claim 23, further comprising determining a reflectivity of each of said ARC layers.

32. The method of claim 23, wherein determining at least one of an index of refraction and an extinction coefficient of said ARC layers comprises averaging a plurality of optical measurements of said ARC layers.

33. The method of claim 23, further comprising performing said stepper exposure process, comprised of said determined at least one parameter, on at least one additional wafer.

* * * * *